(12) United States Patent
Li et al.

(10) Patent No.: US 12,323,172 B2
(45) Date of Patent: Jun. 3, 2025

(54) POWER AMPLIFIER AND WIRELESS TRANSMITTER

(71) Applicant: DECO INTEGRATION TECHNOLOGY CO., LIMITED, Shenzhen (CN)

(72) Inventors: Cheng Li, Shenzhen (CN); Tso Wei Li, Shenzhen (CN)

(73) Assignee: DECO INTEGRATION TECHNOLOGY CO., LIMITED, Shenzhen (CN)

( * ) Notice: Subject to any disclaimer, the term of this patent is extended or adjusted under 35 U.S.C. 154(b) by 0 days.

(21) Appl. No.: 18/814,260

(22) Filed: Aug. 23, 2024

(65) Prior Publication Data
US 2024/0421838 A1     Dec. 19, 2024

Related U.S. Application Data

(63) Continuation of application No. PCT/CN2023/137918, filed on Dec. 11, 2023.

(30) Foreign Application Priority Data

Mar. 28, 2023 (CN) .......................... 202310350353.3
May 15, 2023 (CN) .......................... 202310545476.2

(51) Int. Cl.
*H03F 3/191*     (2006.01)
*H03F 1/56*     (2006.01)
(Continued)

(52) U.S. Cl.
CPC .......... *H04B 1/0458* (2013.01); *H03F 1/565* (2013.01); *H03F 3/245* (2013.01); *H04B 2001/0408* (2013.01)

(58) Field of Classification Search
CPC ........................................................ H03F 3/191
(Continued)

(56) References Cited

U.S. PATENT DOCUMENTS 4,835,485 A * 5/1989 Mueller ............. G01R 33/3621
330/277
6,614,311 B2 * 9/2003 Takenaka ................ H03F 3/601
330/306

(Continued)

FOREIGN PATENT DOCUMENTS

CN    105717831 A    6/2016
CN    106656069 A    5/2017
(Continued)

*Primary Examiner* — Henry Choe
(74) *Attorney, Agent, or Firm* — George D. Morgan

(57) ABSTRACT

Disclosed is a power amplifier and a wireless transmitter. The power amplifier includes a power device and a matching network, where an output end of the power device is connected to an input end of the matching network, and the input end of the matching network includes two input ports. The power amplifier further includes a matching capacitor. The matching capacitor is connected in series to the matching network, to enable an impedance difference between the two input ports of the matching network to be within a preset range. The impedance difference between the two input ports of the matching network is enabled to be within the preset range. In this way, consistent impedances can be obtained at the two input ports of the input end of the matching network, thereby maximizing an output power of the power amplifier, and implementing true matching between the power amplifier and an antenna.

9 Claims, 12 Drawing Sheets

(51) Int. Cl.
*H03F 3/24* (2006.01)
*H04B 1/04* (2006.01)

(58) Field of Classification Search
USPC .................................................. 330/302, 305
See application file for complete search history.

(56) References Cited

U.S. PATENT DOCUMENTS

| | | | | |
|---|---|---|---|---|
| 7,282,993 | B2 * | 10/2007 | Okamoto | H03F 3/193 |
| | | | | 330/252 |
| 7,368,996 | B2 * | 5/2008 | Tanoue | H03F 3/24 |
| | | | | 330/301 |
| 7,692,493 | B1 * | 4/2010 | Chen | H03F 3/191 |
| | | | | 330/117 |
| 8,229,377 | B2 | 7/2012 | Kasha et al. | |

FOREIGN PATENT DOCUMENTS

| | | | |
|---|---|---|---|
| CN | 116155219 | A | 5/2023 |
| CN | 116886058 | A | 10/2023 |
| CN | 219960538 | U | 11/2023 |

* cited by examiner

POWER AMPLIFIER AND WIRELESS TRANSMITTER

CROSS-REFERENCE TO RELATED APPLICATIONS

This application claims priority to Chinese Patent Application No. 202310350353.3, filed with the China National Intellectual Property Administration on Mar. 28, 2023 and entitled "POWER AMPLIFIER AND WIRELESS TRANSMITTER", which is incorporated herein by reference in its entirety.

TECHNICAL FIELD

The present application relates to the field of amplifiers, and in particular, to a power amplifier and a wireless transmitter.

BACKGROUND

An existing radio frequency power amplifier is usually of a differential structure, while an antenna is usually of a single-ended structure. Therefore, a matching network needs to be connected between the radio frequency power amplifier and the antenna, to implement matching between the radio frequency power amplifier and the antenna, so that the radio frequency power amplifier of the differential structure can output a maximum power to the antenna.

However, there are two ports at an output side of the matching network, one port is connected to the antenna, the other port is grounded, and there is non-ideal effect at a grounded terminal. This affects the power output by the radio frequency power amplifier to the antenna, failing to maximize the output power of the radio frequency power amplifier.

SUMMARY

A technical problem to be resolved in the present application is to provide a power amplifier and a wireless transmitter, to improve an output power of the power amplifier.

To resolve the foregoing technical problem, a technical solution used in the present application is as follows:

A power amplifier is provided, including a power device and a matching network, where an output end of the power device is connected to an input end of the matching network, and the input end of the matching network includes two input ports. The power amplifier further includes a matching capacitor.

The matching capacitor is connected in series to the matching network, to enable an impedance difference between the two input ports of the matching network to be within a preset range.

To resolve the foregoing technical problem, another technical solution used in the present application is as follows:

A wireless transmitter is provided, including the foregoing power amplifier.

Beneficial effects of the present application are as follows: The matching capacitor is connected in series to the matching network, so that the impedance difference between the two input ports of the matching network is enabled to be within the preset range. In this way, consistent impedances can be obtained at the two input ports of the input end of the matching network, thereby maximizing an output power of the power amplifier, and implementing true matching between the power amplifier and an antenna. It is innovatively discovered that existence of non-ideal effect at a grounded terminal of the matching network causes inconsistent impedances observed at the two input ports of the input end of the matching network, causing the power amplifier to be unable to output a maximum power. The matching capacitor is connected in series to the matching network, so that consistent impedances are observed at the two input ports of the input end of the matching network, thereby greatly improving the output power of the power amplifier.

DETAILED DESCRIPTION OF THE EMBODIMENTS

Figure 1:
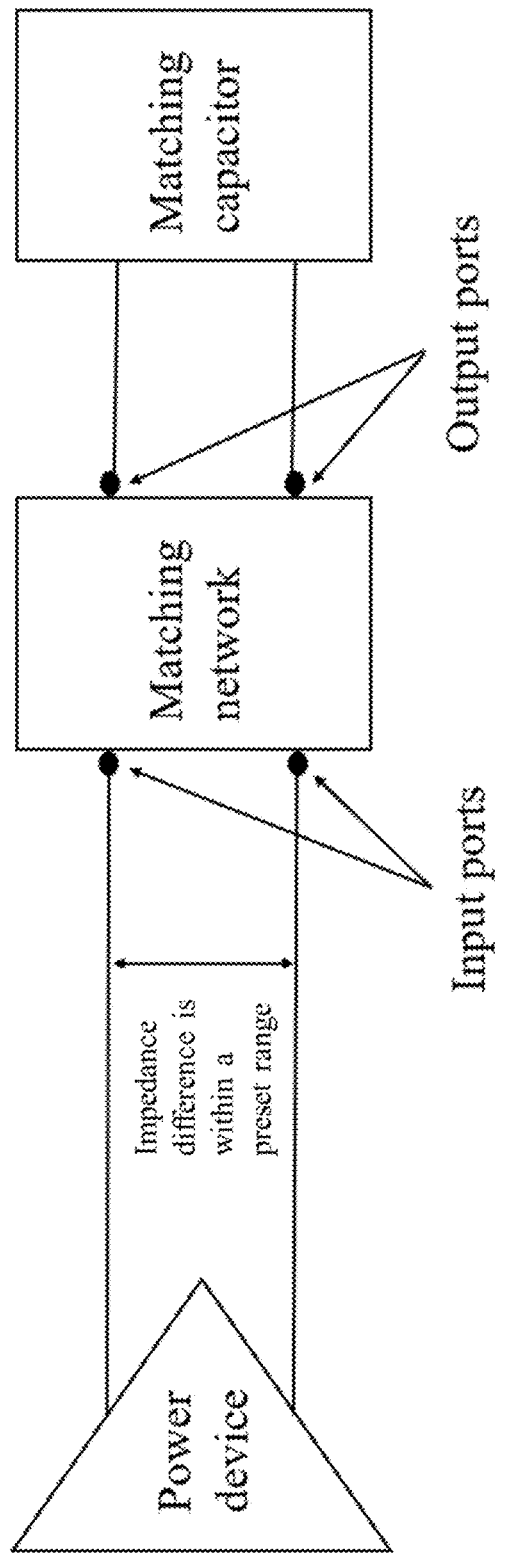
FIG. 1 is a diagram of a circuit structure of a power amplifier according to an embodiment of the present application.

To describe in detail the technical content, intended objectives and effects of the present application, the following provides descriptions with reference to implementations and accompanying drawings.

Refer to FIG. 1 to FIG. 12. A power amplifier is provided, including a power device and a matching network, where an output end of the power device is connected to an input end of the matching network, and the input end of the matching network includes two input ports. The power amplifier further includes a matching capacitor.

The matching capacitor is connected in series to the matching network, to enable an impedance difference between the two input ports of the matching network to be within a preset range.

It can be learned from the foregoing description that beneficial effects of the present application are as follows: The matching capacitor is connected in series to the matching network, so that the impedance difference between the two input ports of the matching network is enabled to be within the preset range. In this way, consistent impedances can be obtained at the two input ports of the input end of the matching network, thereby maximizing an output power of the power amplifier, and implementing true matching between the power amplifier and an antenna. It is innovatively discovered that existence of non-ideal effect at a grounded terminal of the matching network causes inconsistent impedances observed at the two input ports of the input end of the matching network, causing the power amplifier to be unable to output a maximum power. The matching capacitor is connected in series to the matching network, so that consistent impedances are observed at the two input ports of the input end of the matching network, thereby greatly improving the output power of the power amplifier.

Further, the matching capacitor includes a first capacitor and a second capacitor.

The first capacitor and the second capacitor have different capacitances.

An output end of the matching network includes two output ports, and the first capacitor and the second capacitor are respectively connected in series to the two output ports.

It can be learned from the foregoing descriptions that two capacitors of different capacitances are respectively connected in series to the two output ports of the matching network, so that there is no need to introduce an inductor, and only two capacitors are needed for output. Consistent impedances can be conveniently and quickly observed at the two input ports of the input end of the matching network without excessively increasing an area of the matching network, thereby enabling a voltage and a phase to be consistent between two stages of the power amplifier, and effectively improving a transmission power.

Further, an output end of the matching network includes two output ports, one of the output ports is grounded, and the other output port is connected in series to the matching capacitor.

It can be learned from the foregoing descriptions that, because a capacitor provided by the matching network is usually connected in series or in parallel, the problem of inconsistent impedances at the input end of the matching network cannot be resolved by using such a capacitor. The matching capacitor is further connected in series to a non-grounded terminal of the matching network, so that the problem of inconsistent impedances at the input end of the matching network can be resolved to some extent.

Further, a third capacitor and a fourth capacitor are further included.

The third capacitor and the fourth capacitor have different capacitances.

The third capacitor and the fourth capacitor are respectively connected in parallel to the two input ports.

It can be learned from the foregoing descriptions that, on the basis of connecting the matching capacitor in series to the non-grounded terminal of the matching network, two capacitors of different capacitances are respectively connected in series to the two input ports of the matching network, thereby better resolving the problem of inconsistent impedances at the input end of the matching network.

Further, a first inductor is further included.

The first inductor is connected in series to the matching capacitor.

It can be learned from the foregoing descriptions that, on the basis of connecting the matching capacitor in series to the non-grounded terminal of the matching network, an inductor is further connected in series to the non-grounded terminal of the matching network, thereby better resolving the problem of inconsistent impedances at the input end of the matching network.

Further, a second inductor is further included.

One end of the second inductor is connected to one end that is of the matching capacitor and that is close to the matching network, and the other end of the second inductor is grounded.

It can be learned from the foregoing descriptions that, on the basis of connecting the matching capacitor in series to the non-grounded terminal of the matching network, an inductor is further connected in parallel between the two output ports of the matching network, thereby better resolving the problem of inconsistent impedances at the input end of the matching network.

Further, the matching network is a balun.

Further, the balun includes a transformer.

The output end of the power device is connected to a primary side of the transformer.

The matching capacitor is connected in series to a secondary side of the transformer, to enable an impedance difference between a P terminal and an N terminal on the primary side of the transformer to be within a preset range.

Further, the matching capacitor is a resonant capacitor.

Further, the resonant capacitor includes a fifth capacitor and a third inductor.

The fifth capacitor and the third inductor are connected in parallel.

It can be learned from the foregoing descriptions that the matching capacitor may be implemented by using a resonant capacitor (LC Resonator) in which a capacitor is connected in parallel to an inductor. That is, a resonator that exhibits a capacitive behavior is used to implement the matching capacitor. This improves implementation flexibility of the matching capacitor and expands an application range of the matching capacitor.

A wireless transmitter is provided, including the foregoing power amplifier.

The power amplifier and the wireless transmitter in this application can be applied to an application scenario in which matching effect of the matching network is poor due to the non-ideal effect at the grounded terminal of the matching network, and the following is described by using specific implementations.

In an optional implementation, as shown in FIG. 1, a power amplifier includes a power device and a matching network, where an output end of the power device is connected to an input end of the matching network, and the input end of the matching network includes two input ports. The power amplifier further includes a matching capacitor.

The matching capacitor is connected in series to the matching network, to enable an impedance difference between the two input ports of the matching network to be within a preset range.

The preset range may be flexibly set based on a specific application scenario. For example, the preset range may be set to 5 ohms. After the matching capacitor is connected in series to the matching network, impedance values observed at the two ports of the input end of the matching network can be calculated. A difference between the impedance values observed at the two ports is compared, to adjust a capacitance of the matching capacitor connected in series. If the difference is within 5 ohms, it indicates that the impedance values observed at the two ports of the input end of the matching network are consistent.

In another optional implementation, preset ranges of reactance and resistance may be set separately, and then the capacitance of the matching capacitor connected in series is adjusted until both a resistance difference and a reactance difference are within the preset ranges.

Figure 2:
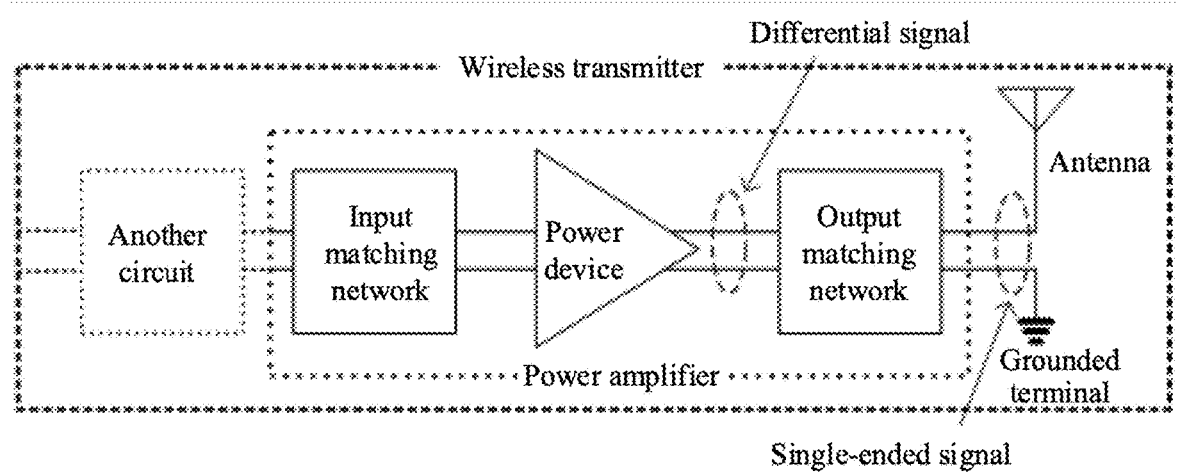
FIG. 2 is a diagram of a circuit structure of a wireless transmitter according to an embodiment of the present application.

FIG. 2 is a diagram of a circuit structure of a wireless transmitter, including an input matching network, a power device, an output matching network, and an antenna that are sequentially connected. The input matching network, the power device, and the output matching network form a power amplifier. The power device may be a differential amplifier. An output end of the power amplifier may be connected to the antenna in the wireless transmitter. A function of the output matching network is to adjust an impedance between the power amplifier and the antenna, to maximize a power transmitted by the power amplifier to the antenna.

Because the antenna is of a single-ended structure, the output matching network needs to convert a differential signal output by the power amplifier into a single-ended signal. Therefore, the output matching network has two functions: one is to adjust an impedance between the power amplifier and the antenna, and the other is to convert a differential signal of the power amplifier into a single-ended signal.

In an optional implementation, a balun (Balun) may be used as a matching network to match the power amplifier and the antenna.

Specifically, the matching network may include a transformer, and the output end of the power device is connected to a primary side of the transformer.

A matching capacitor is connected in series to a secondary side of the transformer, to enable an impedance difference between a P terminal and an N terminal on the primary side of the transformer to be within a preset range.

There are many ways to implement the series connection between the matching capacitor and the matching network.

Figure 3:
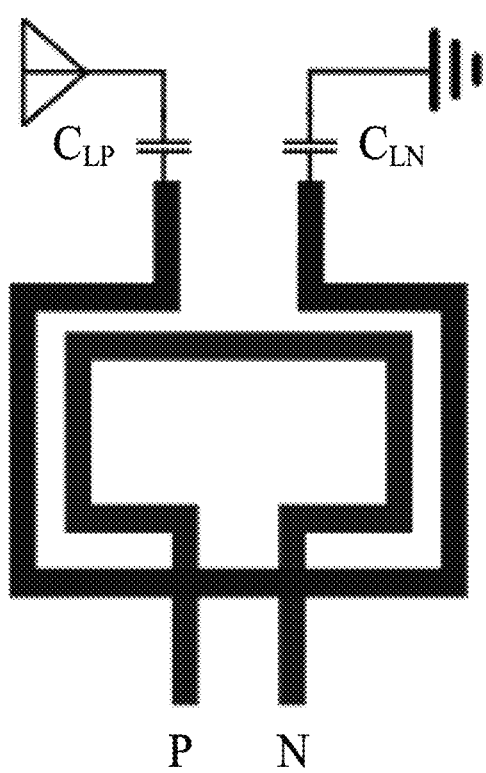
FIG. 3 is a diagram of a circuit structure of an implementation of a matching network in a power amplifier according to an embodiment of the present application.

In an optional implementation, as shown in FIG. 3, the matching capacitor includes a first capacitor $C_{LP}$ and a second capacitor $C_{LN}$.

The first capacitor $C_{LP}$ and the second capacitor $C_{LN}$ have different capacitances.

An output end of the matching network includes two output ports, and the first capacitor and the second capacitor are respectively connected in series to the two output ports. Specifically, one of the output ports is connected to the second capacitor $C_{LN}$ and then grounded, and the other output port is connected to the first capacitor $C_{LP}$ and then connected to the antenna.

Figure 4:
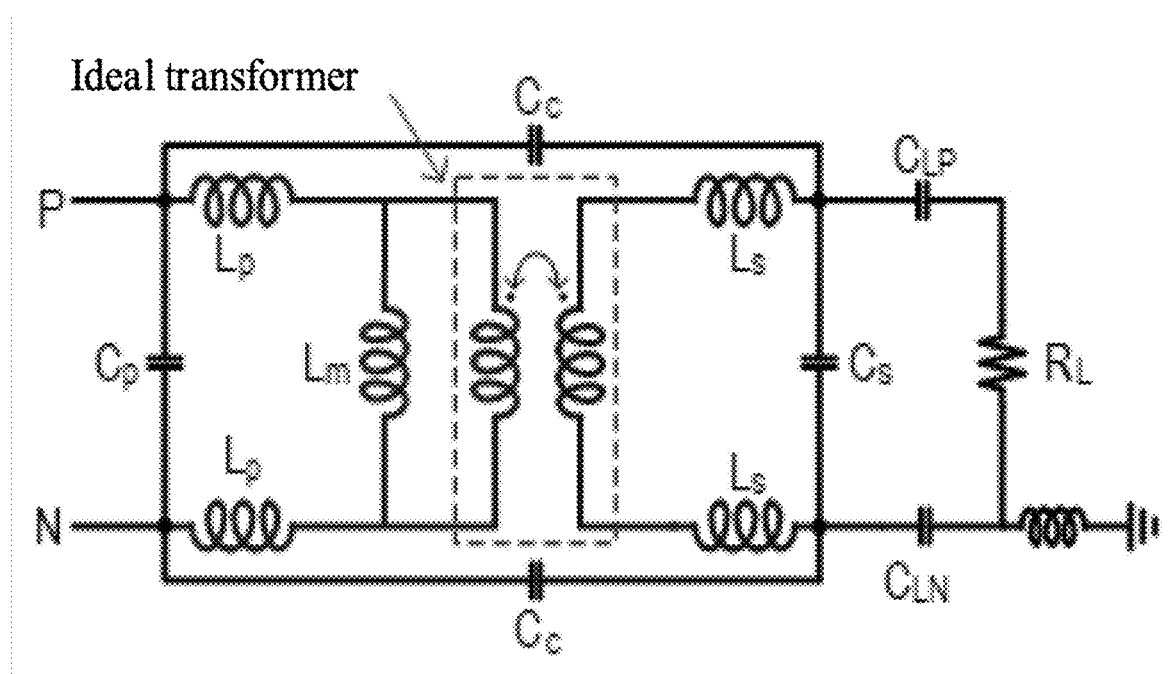
FIG. 4 is a diagram of an equivalent circuit of an implementation of a power amplifier according to an embodiment of the present application.

FIG. 4 is a diagram of an equivalent circuit of the circuit shown in FIG. 3. The radio frequency transformer may be equivalent to an ideal transformer (Ideal transformer), a primary-side (Primary-side) leakage inductor ($L_p$), a secondary-side (Secondary-side) leakage inductor ($L_s$), a magnetizing inductor ($L_m$) and parasitic capacitors (Parasitic Capacitor, $C_p$, $C_s$, and $C_c$). $R_L$, in FIG. 4 is an equivalent impedance of the antenna, and the non-ideal effect at the grounded terminal is equivalent to an inductor $L_{GND}$. Because one end of the secondary side of the transformer is grounded, inconsistent impedances are observed at the P terminal and the N terminal on the primary side, causing the differential power amplifier to be unable to output a maximum power.

In this implementation, the two capacitors $C_{LP}$ and $C_{LN}$ of different capacitances are connected in series to the secondary side of the transformer, so that consistent impedances are observed at the P terminal and the N terminal on the primary side of the transformer, thereby enabling a voltage and a phase to be consistent between two stages of the differential power amplifier, and implementing effective power transmission.

Figure 5:
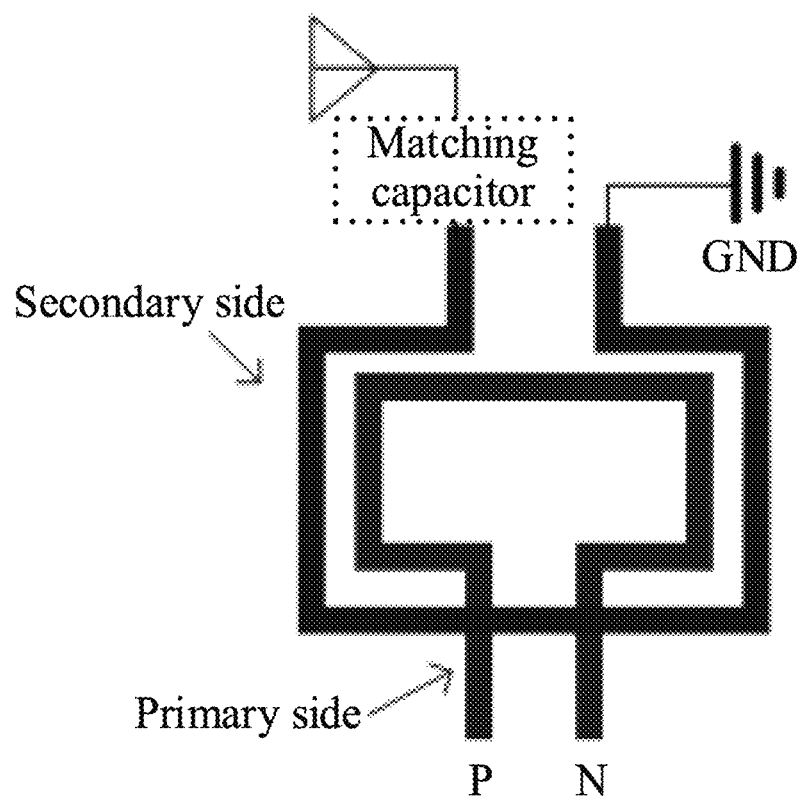
FIG. 5 is a diagram of a circuit structure of another implementation of a power amplifier according to an embodiment of the present application.
Figure 6:
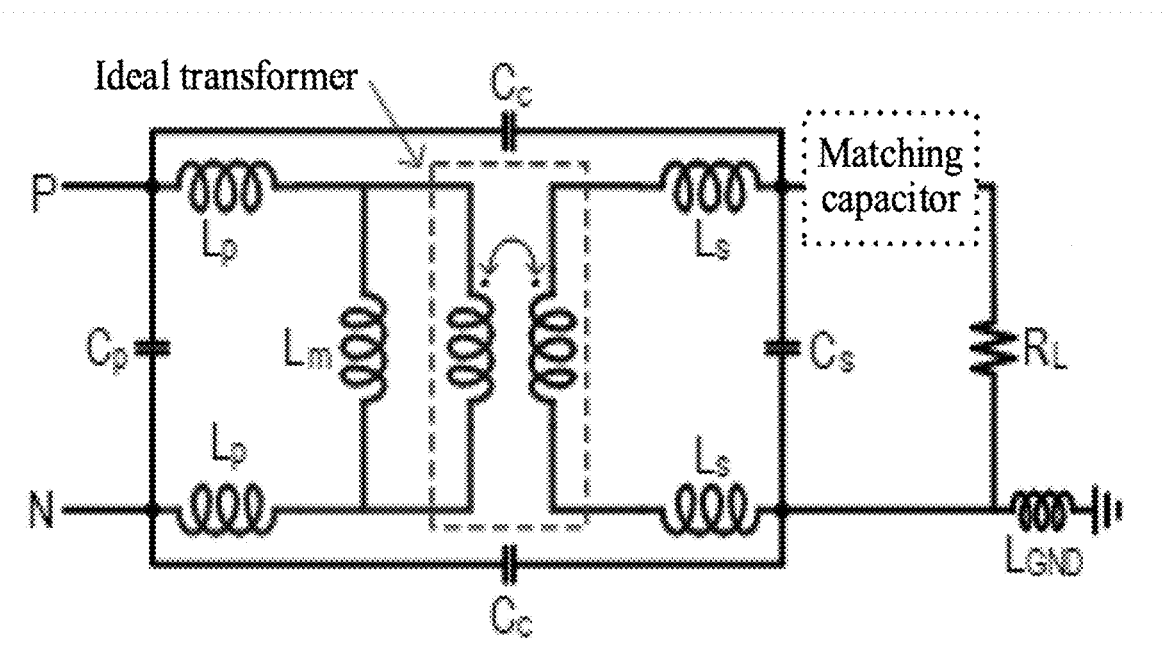
FIG. 6 is a diagram of an equivalent circuit of another implementation of a power amplifier according to an embodiment of the present application.

In another optional implementation, as shown in FIG. 5, an output end of the matching network includes two output ports, one of the output ports is grounded, and the other output port is connected in series to the matching capacitor. That is, the matching capacitor is connected in series at one end that is of the secondary side of the transformer and that is not grounded. FIG. 6 is a diagram of an equivalent circuit of the circuit shown in FIG. 5.

Figure 7:
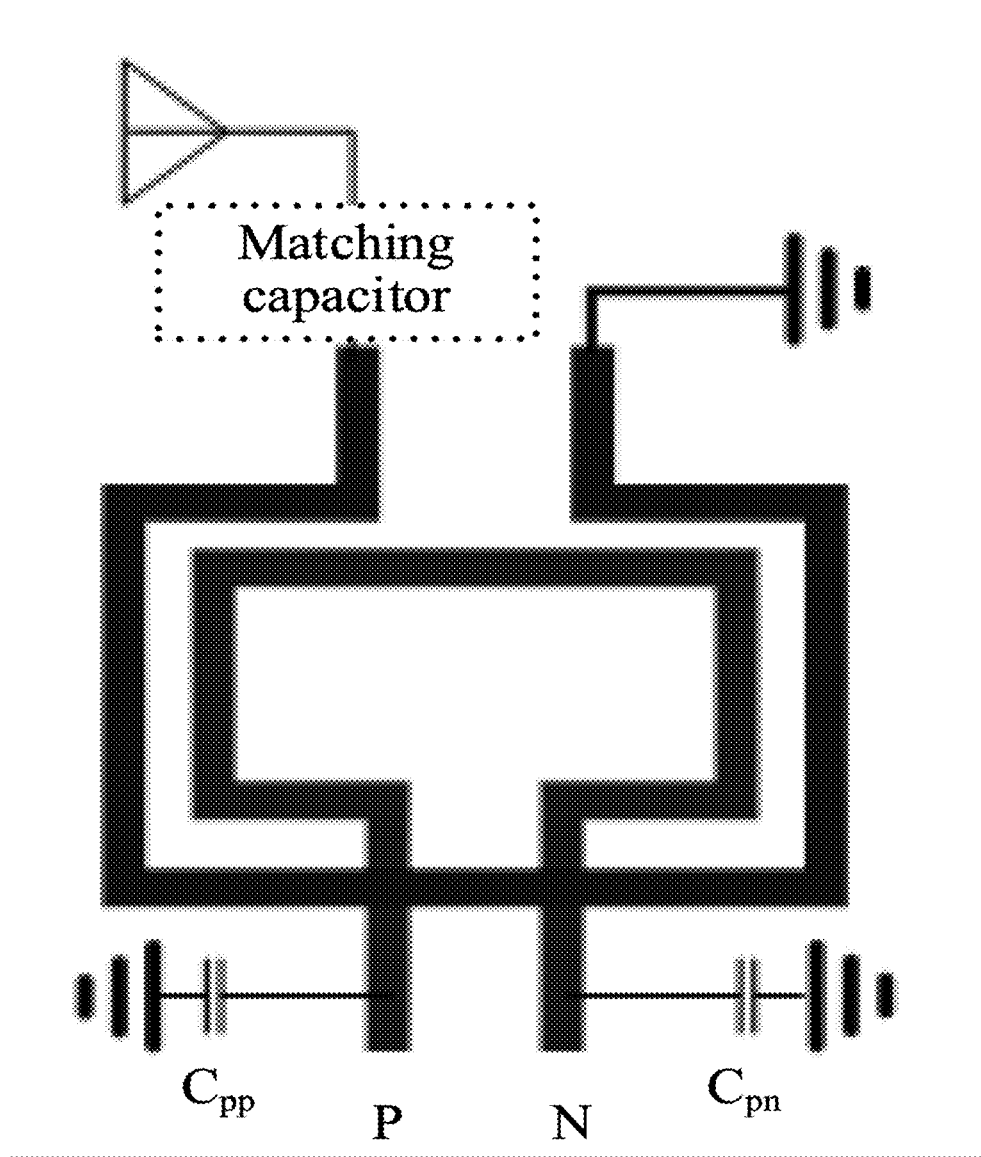
FIG. 7 is a diagram of a circuit structure of another implementation of a power amplifier according to an embodiment of the present application.

On the basis of the circuit structure shown in FIG. 5, to further improve a matching degree between the power amplifier and the antenna and better resolve the problem of inconsistent impedances observed at the P terminal and the N terminal on the primary side of the transformer, the following improvements may be further made:

In a first implementation, as shown in FIG. 7, a third capacitor $C_{pp}$ and a fourth capacitor $C_{pn}$ are further included.

The third capacitor $C_{pp}$ and the fourth capacitor $C_{pn}$ have different capacitances.

The third capacitor $C_{pp}$ and the fourth capacitor $C_{pn}$ are respectively connected in parallel to the two input ports. That is, one end of the third capacitor $C_{pp}$ is connected to a P port on the primary side of the transformer, and the other end is grounded; and one end of the fourth capacitor $C_{pn}$ is connected to an N port on the primary side of the transformer, and the other end is grounded.

Figure 8:
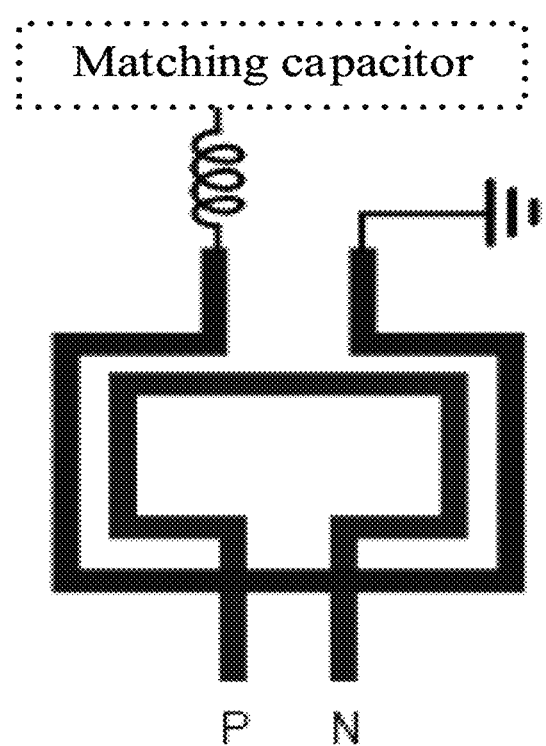
FIG. 8 is a diagram of a circuit structure of another implementation of a power amplifier according to an embodiment of the present application.
Figure 9:
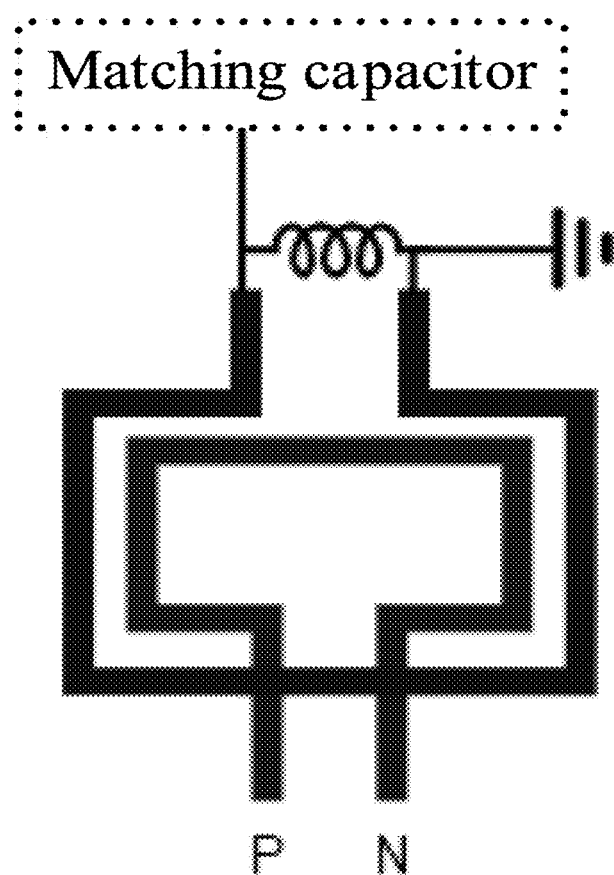
FIG. 9 is a diagram of a circuit structure of another implementation of a power amplifier according to an embodiment of the present application.

In a second implementation, as shown in FIG. 8, a first inductor is further included, and the inductor is a series inductor.

The first inductor is connected in series to the matching capacitor. That is, the non-grounded terminal on the secondary side of the transformer is connected to one end of the first inductor, and the other end of the first inductor is connected to one end that is of the matching capacitor and that is close to the transformer.

In a third implementation, a second inductor is further included, and the inductor is a parallel inductor.

One end of the second inductor is connected to one end that is of the matching capacitor and that is close to the matching network, and the other end of the second inductor is grounded.

Figure 10:
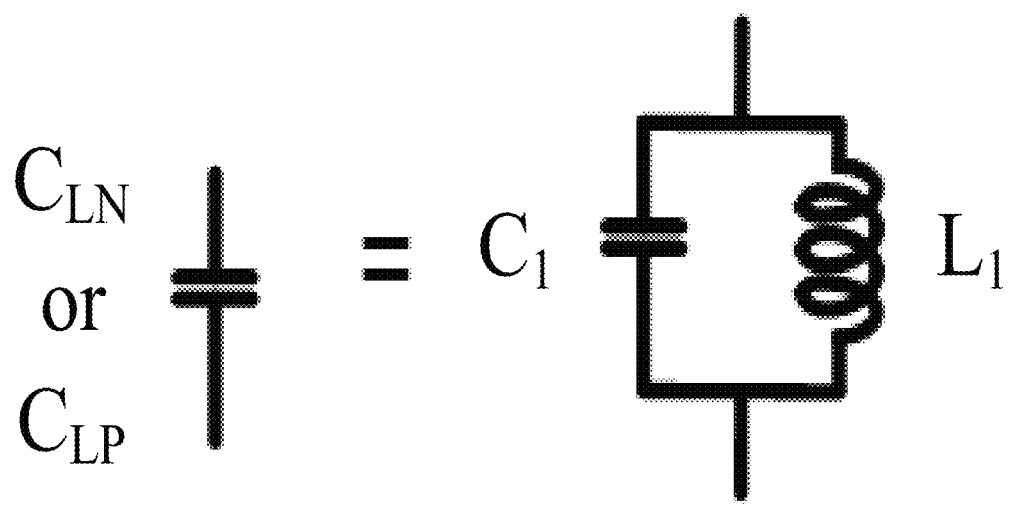
FIG. 10 is a diagram of a circuit structure of an implementation of a matching capacitor of a power amplifier according to an embodiment of the present application.

In another optional implementation, as shown in FIG. 10, the matching capacitor may be a resonant capacitor.

Specifically, the resonant capacitor includes a fifth capacitor $C_1$ and a third inductor $L_1$.

The fifth capacitor $C_1$ and the third inductor $L_1$ are connected in parallel, where $$C_{LN} \text{ or } C_{LP} = (\omega^2 L_1 C_1 - 1)/\omega^2 L_1$$

That is, in this implementation, the matching capacitor is implemented by using an LC resonator in which a capacitor is connected in parallel to an inductor, and enabling the LC resonator to exhibit a capacitive behavior.

Figure 11:
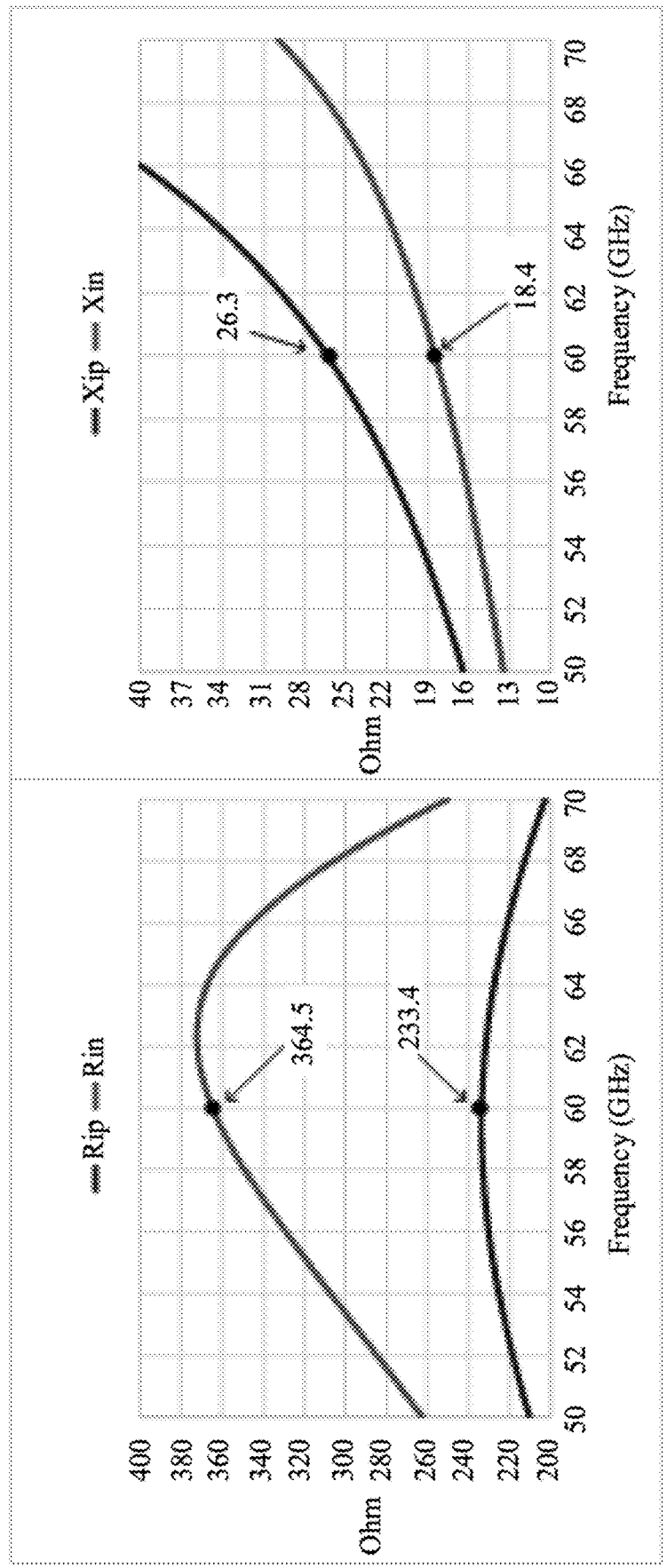
FIG. 11 is a diagram of simulation results of impedances observed on a primary side of a transformer in a power amplifier in the conventional technology.
Figure 12:
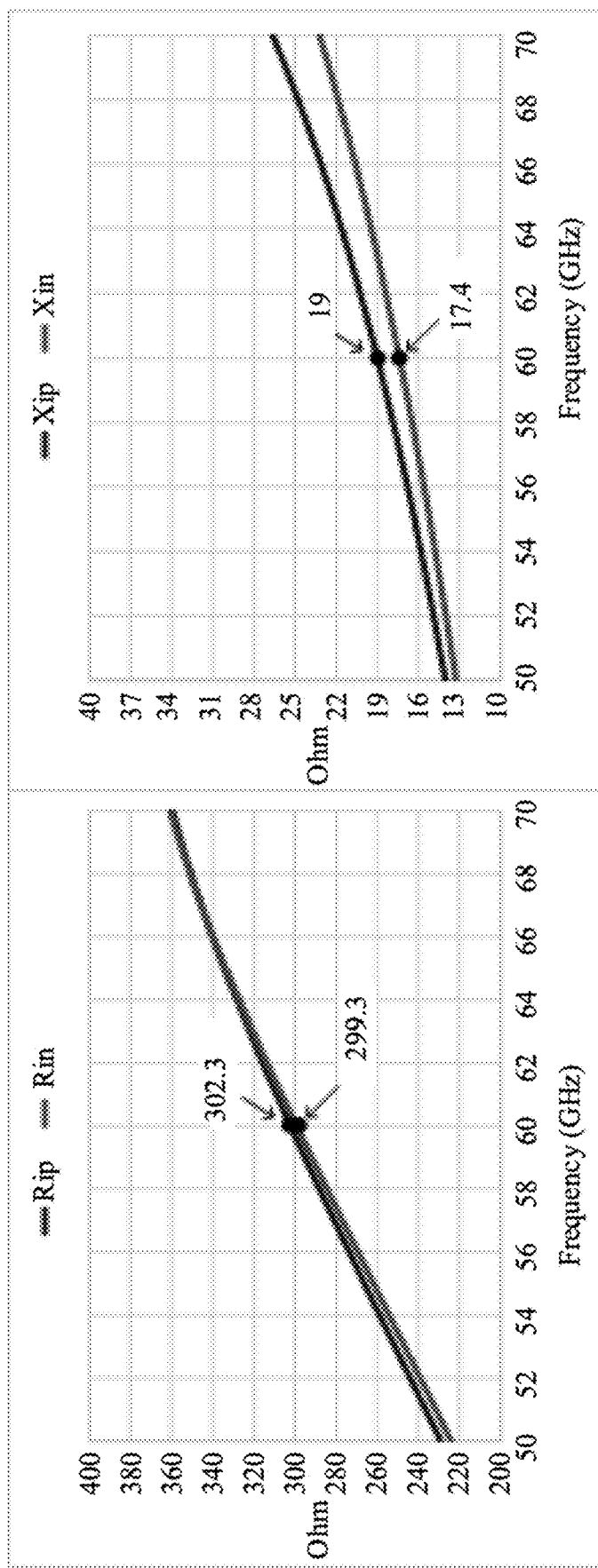
FIG. 12 is a diagram of simulation results of impedances observed on a primary side of a transformer in a power amplifier according to an embodiment of the present application.

FIG. 11 and FIG. 12 are respectively diagrams of simulation results of an existing power amplifier without a connected matching capacitor and a power amplifier with a connected matching capacitor in this application.

FIG. 11 shows simulation results of input impedances observed at the P terminal and the N terminal of the transformer when the matching capacitor is not connected (the left figure is a real part, and the right figure is an imaginary part). In the left figure, the upper curve shows resistance values measured at the P terminal, and an input resistance at the P terminal is 364.5 ohms; and the lower curve shows resistance values measured at the N terminal, and an input resistance at the N terminal is 233.4 ohms. In the right figure, the upper curve shows reactance values measured at the P terminal, and an input reactance at the P terminal is 26.3 ohms; and the lower curve shows reactance values measured at the N terminal, and an input reactance at the N terminal is 18.4 ohms. Therefore, an input differential mode resistance difference is up to 131.1 ohms, and an input differential mode reactance difference is up to 7.9 ohms.

FIG. 12 shows simulation results of input impedances observed at the P terminal and the N terminal of the transformer when the matching capacitor is connected (the left figure is a real part, and the right figure is an imaginary part). In the left figure, the upper curve shows resistance values measured at the P terminal, and an input resistance at the P terminal is 302.3 ohms; and the lower curve shows resistance values measured at the N terminal, and an input resistance at the N terminal is 299.3 ohms. In the right figure, the upper curve shows reactance values measured at the P terminal, and an input reactance at the P terminal is 19 ohms; and the lower curve shows reactance values measured at the N terminal, and an input reactance at the N terminal is 17.4 ohms. Therefore, an input differential mode resistance difference is only 3 ohms, and an input differential mode reactance difference is only 1.6 ohms.

Through the simulation comparison, it can be learned that introduction of the matching capacitor ensures consistency of impedances observed at the P terminal and the N terminal on the primary side of the transformer, thereby resolving impact of the non-ideal effect at the grounded terminal of the matching network on power matching of the matching network, and greatly improving the output power of the power amplifier.

In another optional implementation, a wireless transmitter is provided, including the power amplifier according to any one of the foregoing implementations.

In conclusion, according to the power amplifier and the wireless transmitter that are provided in the present application, the matching capacitor is connected in series to the matching network, so that the impedance difference between the two input ports of the matching network is enabled to be within the preset range. In this way, consistent impedances can be obtained at the two input ports of the input end of the matching network, thereby maximizing an output power of the power amplifier, and implementing true matching between the power amplifier and the antenna. The matching capacitor may be connected in series to the matching network in different manners. The series connection manners are diverse and flexible. It is innovatively discovered that existence of the non-ideal effect at the grounded terminal of the matching network causes inconsistent impedances observed at the two input ports of the input end of the matching network, causing the power amplifier to be unable to output a maximum power. The matching capacitor is connected in series to the matching network, so that consistent impedances are observed at the two input ports of the input end of the matching network, thereby greatly improving the output power of the power amplifier.

The foregoing descriptions are merely embodiments of the present application, but are not intended to limit the patent scope of the present application. Any equivalent transformations that are made by using the content of the specification and drawings of the present application, or directly or indirectly applied in related technical fields, are similarly included in the patent protection scope of the present application.

What is claimed is:

1. A power amplifier, comprising a power device and a matching network, wherein an output end of the power device is connected to an input end of the matching network, the input end of the matching network comprises two input ports, and the power amplifier further comprises a matching capacitor, wherein
    the matching capacitor is connected in series to the matching network, and an impedance difference between the two input ports of the matching network is configured to be within a preset range by adjusting a capacitance of the matching capacitor;
    an output end of the matching network comprises two output ports, one of the output ports is grounded, and the other output port is connected in series to the matching capacitor; and
    the power amplifier further comprises a third capacitor and a fourth capacitor, the third capacitor and the fourth capacitor have different capacitances, and the third capacitor and the fourth capacitor are respectively connected in parallel to the two input ports.

2. The power amplifier according to claim 1, wherein the matching capacitor comprises a first capacitor and a second capacitor;
    the first capacitor and the second capacitor have different capacitances; and
    an output end of the matching network comprises two output ports, and the first capacitor and the second capacitor are respectively connected in series to the two output ports.

3. The power amplifier according to claim 1, further comprising a first inductor, wherein
    the first inductor is connected in series to the matching capacitor.

4. The power amplifier according to claim 1, further comprising a second inductor, wherein
    one end of the second inductor is connected to one end that is of the matching capacitor and that is close to the matching network, and the other end of the second inductor is grounded.

5. The power amplifier according to claim 1, wherein the matching network is a balun.

6. The power amplifier according to claim 5, wherein the balun comprises a transformer;
    the output end of the power device is connected to a primary side of the transformer; and
    the matching capacitor is connected in series to a secondary side of the transformer, to enable an impedance difference between a P terminal and an N terminal on the primary side of the transformer to be within a preset range.

7. The power amplifier according to claim 1, wherein the matching capacitor is a resonant capacitor.

8. The power amplifier according to claim 7, wherein the resonant capacitor comprises a fifth capacitor and a third inductor; and the fifth capacitor and the third inductor are connected in parallel.

9. A wireless transmitter, comprising the power amplifier according to claim 1.

* * * * *